US012665174B2

(12) United States Patent (10) Patent No.: US 12,665,174 B2
Inoue et al. (45) **Date of Patent: *Jun. 23, 2026**

(54) WAFER PLACEMENT TABLE

(71) Applicant: NGK INSULATORS, LTD., Nagoya-City (JP)

(72) Inventors: Seiya Inoue, Handa-City (JP); Tatsuya Kuno, Nagoya-City (JP)

(73) Assignee: NGK INSULATORS, LTD., Nagoya (JP)

( * ) Notice: Subject to any disclaimer, the term of this patent is extended or adjusted under 35 U.S.C. 154(b) by 21 days.

This patent is subject to a terminal disclaimer.

(21) Appl. No.: 18/895,491

(22) Filed: Sep. 25, 2024

(65) Prior Publication Data

US 2025/0014875 A1 Jan. 9, 2025

Related U.S. Application Data

(63) Continuation of application No. 18/170,025, filed on Feb. 16, 2023, now Pat. No. 12,176,186.

(30) Foreign Application Priority Data

Apr. 25, 2022 (JP) ................................. 2022-071356

(51) Int. Cl.
*H01J 37/32* (2006.01)
(52) U.S. Cl.
CPC .. *H01J 37/32724* (2013.01); *H01J 37/32807* (2013.01)
(58) Field of Classification Search
CPC ...................... H01J 37/32724; H01J 37/32807
See application file for complete search history.

(56) References Cited

U.S. PATENT DOCUMENTS

| | | | |
|---|---|---|---|
| 6,391,437 | B1 | 5/2002 | Kadomura et al. |
| 2005/0219786 | A1 | 10/2005 | Brown et al. |
| 2006/0279899 | A1 | 12/2006 | Aihara et al. |

(Continued)

FOREIGN PATENT DOCUMENTS

| | | |
|---|---|---|
| CN | 103972132 A | 8/2014 |
| CN | 109935511 A | 6/2019 |

(Continued)

OTHER PUBLICATIONS

Korean Office Action (with English translation) dated May 25, 2025 (Application No. 10-2023-0021635).

(Continued)

*Primary Examiner* — Henry Luong
(74) *Attorney, Agent, or Firm* — Muncy, Geissler, Olds & Lowe, P.C.

(57) ABSTRACT

A wafer placement table includes a ceramic substrate having a wafer placement surface on an upper surface thereof and containing an electrode therein; a conductive substrate disposed adjacent to a lower surface of the ceramic substrate, serving also as a plasma generating electrode, and having the same diameter as the ceramic substrate; a support substrate disposed adjacent to a lower surface of the conductive substrate, having a greater diameter than the conductive substrate, and electrically insulated from the conductive substrate; and a mounting flange constituting a part of the support substrate and radially extending out of the conductive substrate.

9 Claims, 6 Drawing Sheets

(56)                References Cited

U.S. PATENT DOCUMENTS

| | | |
|---|---|---|
| 2007/0283891 A1 | 12/2007 | Okayama |
| 2008/0212255 A1 | 9/2008 | Miyaji et al. |
| 2014/0202386 A1 | 7/2014 | Taga et al. |
| 2015/0077895 A1 | 3/2015 | Jindo et al. |
| 2017/0229286 A1 | 8/2017 | Aita et al. |
| 2017/0278737 A1 | 9/2017 | Koiwa |
| 2018/0204757 A1 | 7/2018 | Fushimi |
| 2018/0350570 A1 | 12/2018 | Endo et al. |
| 2019/0189396 A1 | 6/2019 | Iwase et al. |
| 2019/0189491 A1 | 6/2019 | Akatsuka |
| 2019/0348316 A1 | 11/2019 | Hayashi |
| 2020/0027769 A1 | 1/2020 | Simmons et al. |
| 2020/0185248 A1 | 6/2020 | Sarode Vishwanath et al. |
| 2020/0194240 A1 | 6/2020 | Sasaki et al. |
| 2020/0219729 A1 | 7/2020 | Kamimura et al. |
| 2021/0391152 A1 | 12/2021 | Koiwa |
| 2023/0343564 A1 | 10/2023 | Inoue et al. |

FOREIGN PATENT DOCUMENTS

| | | |
|---|---|---|
| JP | H05-304201 A | 11/1993 |
| JP | H08-279550 A | 10/1996 |
| JP | H11-121598 A | 4/1999 |
| JP | 2001-144167 A | 5/2001 |
| JP | 2001-257253 A | 9/2001 |
| JP | 2002-261158 A | 9/2002 |
| JP | 2003-017551 A | 1/2003 |
| JP | 2006-344955 A | 12/2006 |
| JP | 3921913 B2 | 5/2007 |
| JP | 2007-243139 A | 9/2007 |
| JP | 2007-266342 A | 10/2007 |
| JP | 2009-065033 A | 3/2009 |
| JP | 2017-126641 A | 7/2017 |
| JP | 2017-174889 A | 9/2017 |
| JP | 2018-117024 A | 7/2018 |
| JP | 2018-206806 A | 12/2018 |
| JP | 2020-013993 A | 1/2020 |
| JP | 6637184 B2 | 1/2020 |
| JP | 2020-96136 A | 6/2020 |
| JP | 2021-197406 A | 12/2021 |
| JP | 2023-161172 A | 11/2023 |
| KR | 10-2017-0093723 A | 8/2017 |
| KR | 10-2018-0008781 A | 1/2018 |
| KR | 10-2019-0129722 A | 11/2019 |
| KR | 10-2020-0008959 A | 1/2020 |
| KR | 10-2020-0111787 A | 9/2020 |
| KR | 10-2021-0080593 A | 6/2021 |
| TW | 202142054 A * 11/2021 | ......... H01L 21/3065 |
| WO | WO2014141974 A1 | 9/2014 |
| WO | 2016/186702 A1 | 11/2016 |
| WO | 2020/123069 A1 | 6/2020 |

OTHER PUBLICATIONS

Japanese Office Action (with English translation) dated Oct. 22, 2024 (Application No. 2022-071356).

Chinese Office Action (with English translation) dated Aug. 9, 2025 (Application No. 202310005571.3).

Japanese Notice of Submission of Publications dated May 7, 2024 (with English translation) and Submission of Publications by Third Party dated Apr. 11, 2024 (Application No. 2022-071356) (6 pages).

Korean Office Action (with English translation) dated Jul. 4, 2024 (Application No. 10-2023-0021635).

Japanese Office Action (with English translation) dated Feb. 25, 2025 (Application No. 2022-071356).

Chinese Office Action dated Feb. 10, 2026 in corresponding application JP 2025-084612.

Japanese Office Action dated Feb. 10, 2026 in corresponding application JP2025-084612.

* cited by examiner

WAFER PLACEMENT TABLE

CROSS REFERENCE OF RELATED APPLICATIONS

This application is a continuation of U.S. Application Ser. No. 18/170,025, filed Feb. 16, 2023, which claims priority to Japanese Patent Application No. 2022-071356 filed in the Japanese Patent Office on Apr. 25, 2022, the entire contents of which are incorporated herein by reference.

BACKGROUND OF THE INVENTION

1. Field of the Invention

The present invention relates to a wafer placement table.

2. Description of the Related Art

Wafer placement tables that include a ceramic substrate and a conductive cooling substrate have been known. The ceramic substrate has a wafer placement surface and contains an electrode therein, and the cooling substrate is disposed adjacent to a lower surface of the ceramic substrate. For example, Patent Literature (PTL) 1 discloses a wafer placement table of this type that includes a cooling substrate having a greater diameter than a ceramic substrate. A description of exemplary use of the wafer placement table states that a high-frequency voltage may be applied to the cooling substrate to generate plasma.

CITATION LIST

Patent Literature

PTL 1: Japanese Patent No. 6637184

SUMMARY OF THE INVENTION

However, the cooling substrate has a greater diameter than the ceramic substrate, as described above. This means that plasma is generated not only in a region overlapping a wafer in plan view, but also in a region extending out of the wafer in plan view. The plasma generated in the region extending out of the wafer is wasted, as it is not used in wafer processing. This results in reduced plasma density in a region (plasma generation region in design) directly above the ceramic substrate.

The present invention has been made to solve the problem described above. A primary object of the present invention is to increase plasma density in a region directly above a ceramic substrate.

[1] A wafer placement table according to the present invention includes a ceramic substrate having a wafer placement surface on an upper surface thereof and containing an electrode therein; a conductive substrate disposed adjacent to a lower surface of the ceramic substrate, having a cooling medium passage or a cooling medium passage groove, serving also as a plasma generating electrode, and having the same diameter as the ceramic substrate; a support substrate disposed adjacent to a lower surface of the conductive substrate, having a greater diameter than the conductive substrate, and electrically insulated from the conductive substrate; and a mounting flange constituting a part of the support substrate and radially extending out of the conductive substrate.

In the wafer placement table according to the present invention, a part of the support substrate radially extending out of the conductive substrate is used as the mounting flange. Since the support substrate is electrically insulated from the conductive substrate, the mounting flange does not function as a plasma generating electrode. This suppresses generation of plasma in a region directly above the mounting flange, and thus can increase plasma density in a region directly above the ceramic substrate.

Note that in the present specification, the present invention may be described using up and down, right and left, and front and back; however up and down, right and left, and front and back merely indicate a relative positional relationship. Thus, when the orientation of the wafer placement table is changed, up and down may change to right and left, or right and left may change to up and down, and such a case is also included in the technical scope of the present invention.

[2] In the wafer placement table (or in the wafer placement table described in [1]), the support substrate may be formed of an insulating material. This facilitates electrical insulation of the support substrate from the conductive substrate.

[3] In the wafer placement table (or in the wafer placement table described in [2]), a first joining layer configured to join the ceramic substrate to the conductive substrate and a second joining layer configured to join the conductive substrate to the support substrate may both be metal joining layers. Since this allows joining of the ceramic substrate to the conductive substrate and joining of the conductive substrate to the support substrate to take place in the same process, the cost of manufacture is reduced.

[4] In the wafer placement table (or in the wafer placement table described in [2] or [3]), the conductive substrate may have the cooling medium passage groove, and the cooling medium passage groove may have an opening in the surface of the conductive substrate facing the support substrate. Since this eliminates the need for the material on the lower side of the cooling medium passage, the manufacturing cost can be lower than that in the case where the conductive substrate has the cooling medium passage.

[5] In the wafer placement table (or in the wafer placement table described in [1]), the support substrate may be formed of metal, and the support substrate and the conductive substrate may be provided with an insulating layer therebetween. This allows the support substrate to be electrically insulated from the conductive substrate even when the support substrate is made of metal.

[6] In the wafer placement table (or in the wafer placement table described in [5]), the support substrate may have screw holes in a lower surface thereof. Since the support substrate is made of metal, which is a ductile material, the screw holes can be formed in the lower surface of the support substrate. If the support substrate is made of a brittle material (e.g., ceramic or metal-ceramic composite), it is difficult to form screw holes in the support substrate.

DETAILED DESCRIPTION OF THE INVENTION

First Embodiment

Figure 1:
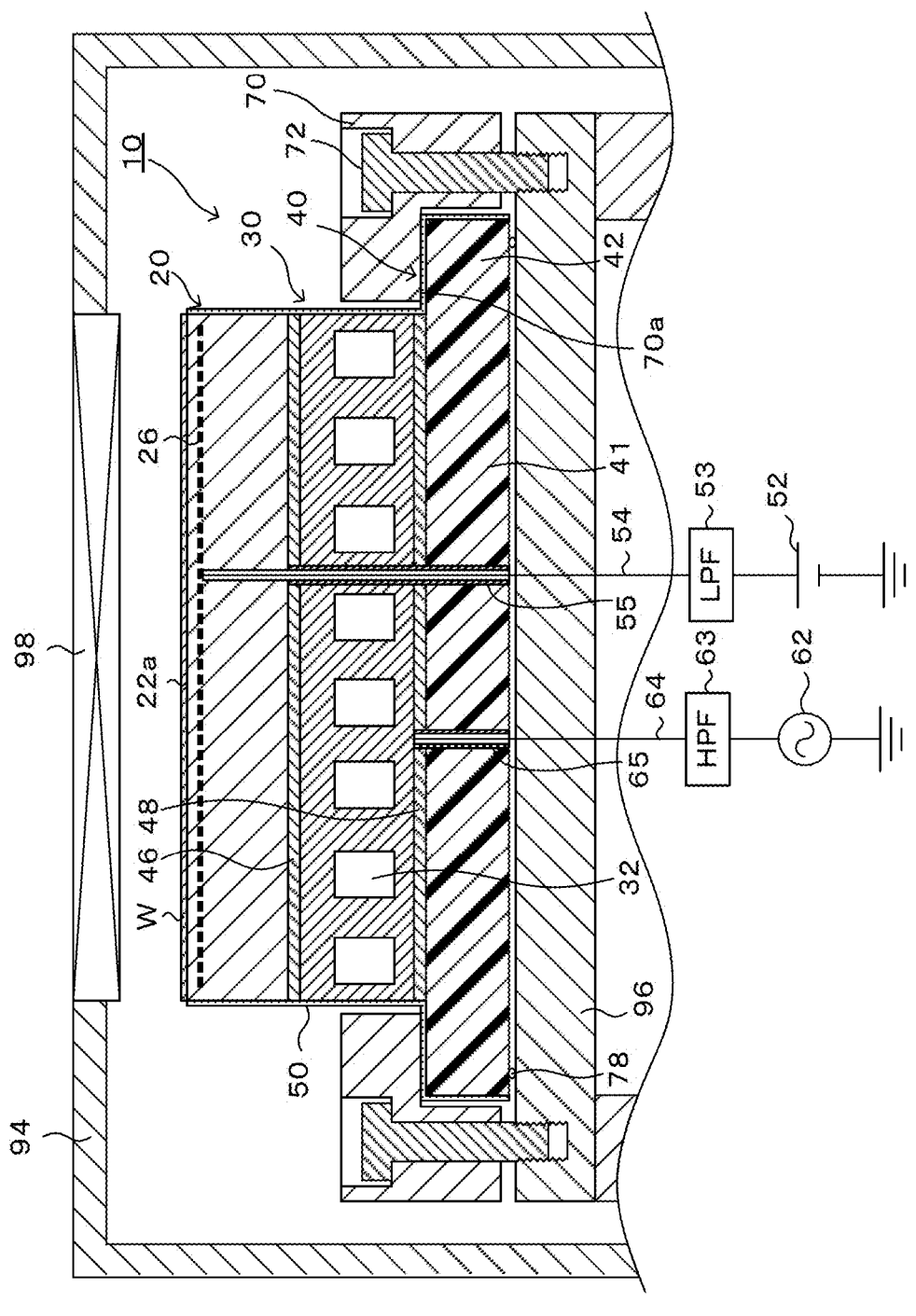
FIG. 1 illustrates a vertical cross-sectional view of a wafer placement table 10 installed in a chamber 94.
Figure 2:
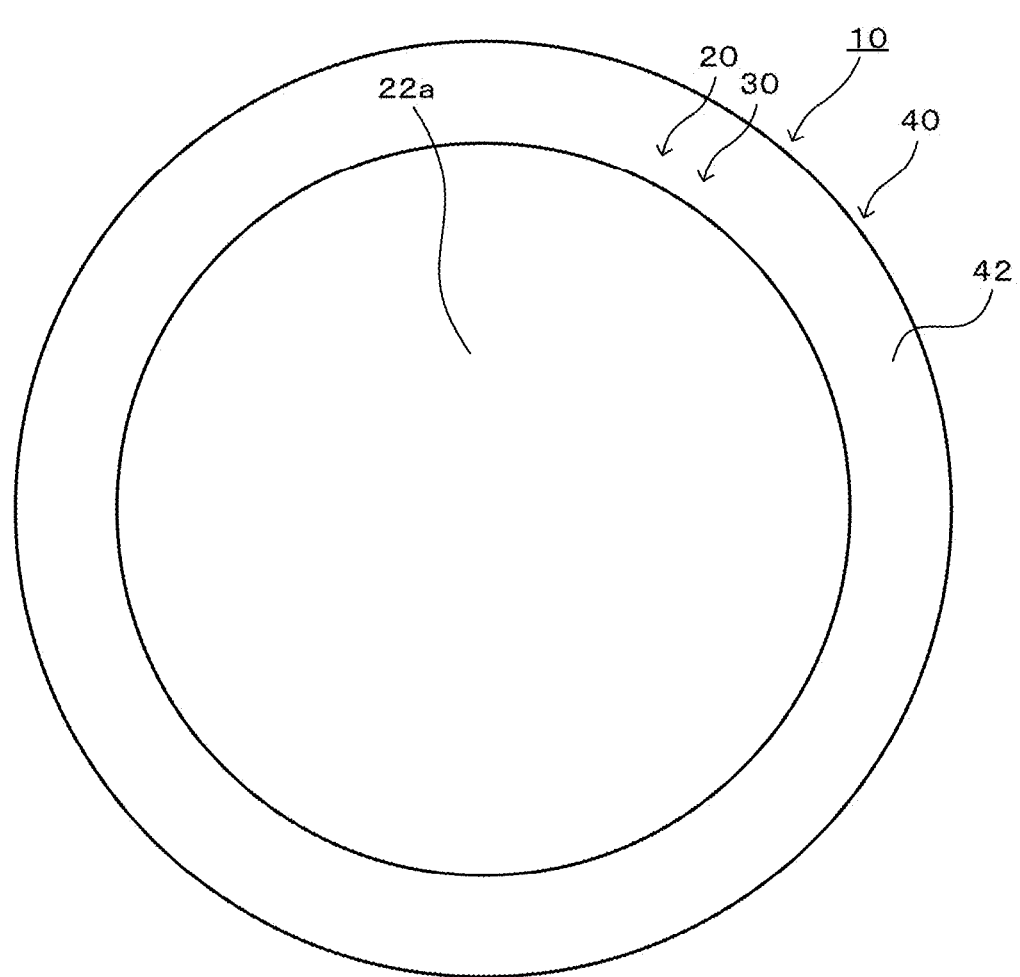
FIG. 2 is a plan view of the wafer placement table 10.

A first embodiment of the present invention will now be described with reference to the drawings. FIG. 1 illustrates a vertical cross-sectional view of a wafer placement table 10 installed in a chamber 94 (i.e., a cross-section taken along a plane containing a central axis of the wafer placement table 10). FIG. 2 is a plan view of the wafer placement table 10.

The wafer placement table 10 is used to perform, for example, plasma CVD or plasma etching on a wafer W. The wafer placement table 10 is secured to an installation plate 96 that is disposed inside the chamber 94 designed for semiconductor processes. The wafer placement table 10 includes a ceramic substrate 20, a conductive substrate 30, and a support substrate 40.

The ceramic substrate 20 is a circular plate having a circular wafer placement surface 22a on an upper surface thereof. The wafer W is placed on the wafer placement surface 22a. The ceramic substrate 20 is formed of a ceramic material, such as alumina or aluminum nitride.

The ceramic substrate 20 contains therein a wafer attracting electrode 26 disposed adjacent to the wafer placement surface 22a. The wafer attracting electrode 26 is formed of a material containing, for example, W, Mo, WC, or MoC. The wafer attracting electrode 26 is a disk-shaped or mesh-type monopolar electrostatic attracting electrode. Of layers of the ceramic substrate 20, a layer above the wafer attracting electrode 26 serves as a dielectric layer. The wafer attracting electrode 26 is connected to a wafer attracting direct-current power supply 52 by a feed terminal 54 therebetween. The feed terminal 54 passes through an insulating pipe 55 and extends from the lower surface of the ceramic substrate 20 to reach the wafer attracting electrode 26. The insulating pipe 55 is disposed in a through hole vertically penetrating the conductive substrate 30, the support substrate 40, a first joining layer 46, and a second joining layer 48. The wafer attracting direct-current power supply 52 and the wafer attracting electrode 26 are provided with a low-pass filter (LPF) 53 therebetween.

The conductive substrate 30 is a circular plate having the same diameter as the ceramic substrate 20 and is disposed adjacent to the lower surface of the ceramic substrate 20. The conductive substrate 30 is used as a cooling substrate for cooling the ceramic substrate 20 and has good thermal conductivity. The conductive substrate 30 has therein a cooling medium passage 32 in which a cooling medium circulates. The cooling medium passage 32 is formed in a one-stroke pattern throughout the conductive substrate 30, in plan view, from one end (entrance) to the other end (exit). The cooling medium passage 32 is connected at the one end and the other end thereof to a supply port and a recovery port, respectively, of an external cooling medium device (not shown). A cooling medium supplied through the supply port of the external cooling medium device to the one end of the cooling medium passage 32 passes through the cooling medium passage 32, and returns through the other end of the cooling medium passage 32 to the recovery port of the external cooling medium device. After being temperature-adjusted, the cooling medium is supplied again through the supply port of the external cooling medium device to the one end of the cooling medium passage 32. The cooling medium passing through the cooling medium passage 32 is preferably a liquid and is preferably an electrically insulating liquid. Examples of the electrically insulating liquid include a fluorinated inert liquid.

The conductive substrate 30 is made of, for example, a metal material or a metal-ceramic composite. Examples of the metal material include Al, Ti, Mo, and alloys of these materials. Examples of the metal-ceramic composite include a metal matrix composite (MMC) and a ceramic matrix composite (CMC). Examples of these composites include a material composed of Si, SiC, and Ti (also referred to as SisiCTi), a SiC porous body impregnated with Al and/or Si, and an $Al_2O_3$—TiC composite. It is preferable that a material with a thermal expansion coefficient close to that of the material of the ceramic substrate 20 be selected as the material of the conductive substrate 30. The conductive substrate 30 also serves as a plasma generating electrode. The conductive substrate 30 is connected to a RF power supply 62 by a feed terminal 64 therebetween. The feed terminal 64 passes through an insulating pipe 65 to reach the lower surface of the conductive substrate 30. The insulating pipe 65 is disposed in a through hole penetrating the support substrate 40 and the second joining layer 48. The feed terminal 64 is provided in the chamber 94 and is biased upward by a spring (not shown). This brings an upper end of the feed terminal 64 into elastic contact with the lower surface of the conductive substrate 30. The insulating pipe 65 is optional in the first embodiment. The conductive substrate 30 and the RF power supply 62 are provided with a high-pass filter (HPF) 63 therebetween.

The support substrate 40 is a circular plate having a greater diameter than the conductive substrate 30 and is disposed adjacent to the lower surface of the conductive substrate 30. The support substrate 40 has a central portion 41 having the same diameter as the conductive substrate 30, and a mounting flange 42 radially extending out of the conductive substrate 30. The support substrate 40 is formed of an insulating material. This allows the support substrate 40 to be electrically insulated from the conductive substrate 30. Examples of the insulating material include ceramic materials, such as alumina and aluminum nitride. It is preferable that a material with a thermal expansion coefficient close to that of the material of the conductive substrate 30 (or the ceramic substrate 20) be selected as the material of the support substrate 40.

The ceramic substrate 20 and the conductive substrate 30 are joined together by the first joining layer 46 therebetween. The conductive substrate 30 and the support substrate 40 are joined together by the second joining layer 48 therebetween. Both the first joining layer 46 and the second joining layer 48 are metal joining layers. For example, the metal joining layers may be layers of solder or brazing metal. A metal joining layer is formed, for example, by thermal compression bonding (TCB). The TCB is a known method in which a metal joining material is placed between two components to be joined, which are then pressure-bonded while being heated to a temperature lower than or equal to the solidus temperature of the metal joining material.

A side face of the ceramic substrate 20, a perimeter of the first joining layer 46, a side face of the conductive substrate 30, a perimeter of the second joining layer 48, and an upper surface and a side face of the mounting flange 42 of the support substrate 40 are coated with an insulating film 50. The insulating film 50 is formed, for example, by thermal spraying with alumina or yttria. In the first embodiment, the insulating film 50 on the side face of the ceramic substrate 20 and the upper surface and the side face of the mounting flange 42 may be partially or entirely removed.

The wafer placement table 10 is mounted by means of a clamp member 70 onto the installation plate 96 disposed inside the chamber 94. The wafer placement table 10 and the installation plate 96 are provided with a seal ring 78 therebetween. The seal ring 78 is a metal or resin ring disposed slightly inside the outer edge of the support substrate 40. The clamp member 70 is an annular member having a substantially inverse L-shape in cross-section. The clamp member 70 has an inner stepped surface 70a. The wafer placement table 10 and the installation plate 96 are integrated into one by the clamp member 70. With the inner stepped surface 70a of the clamp member 70 placed on the mounting flange 42 of the wafer placement table 10, bolts 72 are each inserted from the upper surface of the clamp member 70 and screwed into a screw hole in the upper surface of the installation plate 96. The bolts 72 are mounted at a plurality of (e.g., eight or twelve) points equally spaced along a circumferential direction of the clamp member 70. The clamp member 70 and the bolts 72 may be made of an insulating material, or may be made of a conductive material (such as metal). The bolts 72 are preferably formed of a ductile material (e.g., Ti, Mo, or W).

Figure 3:
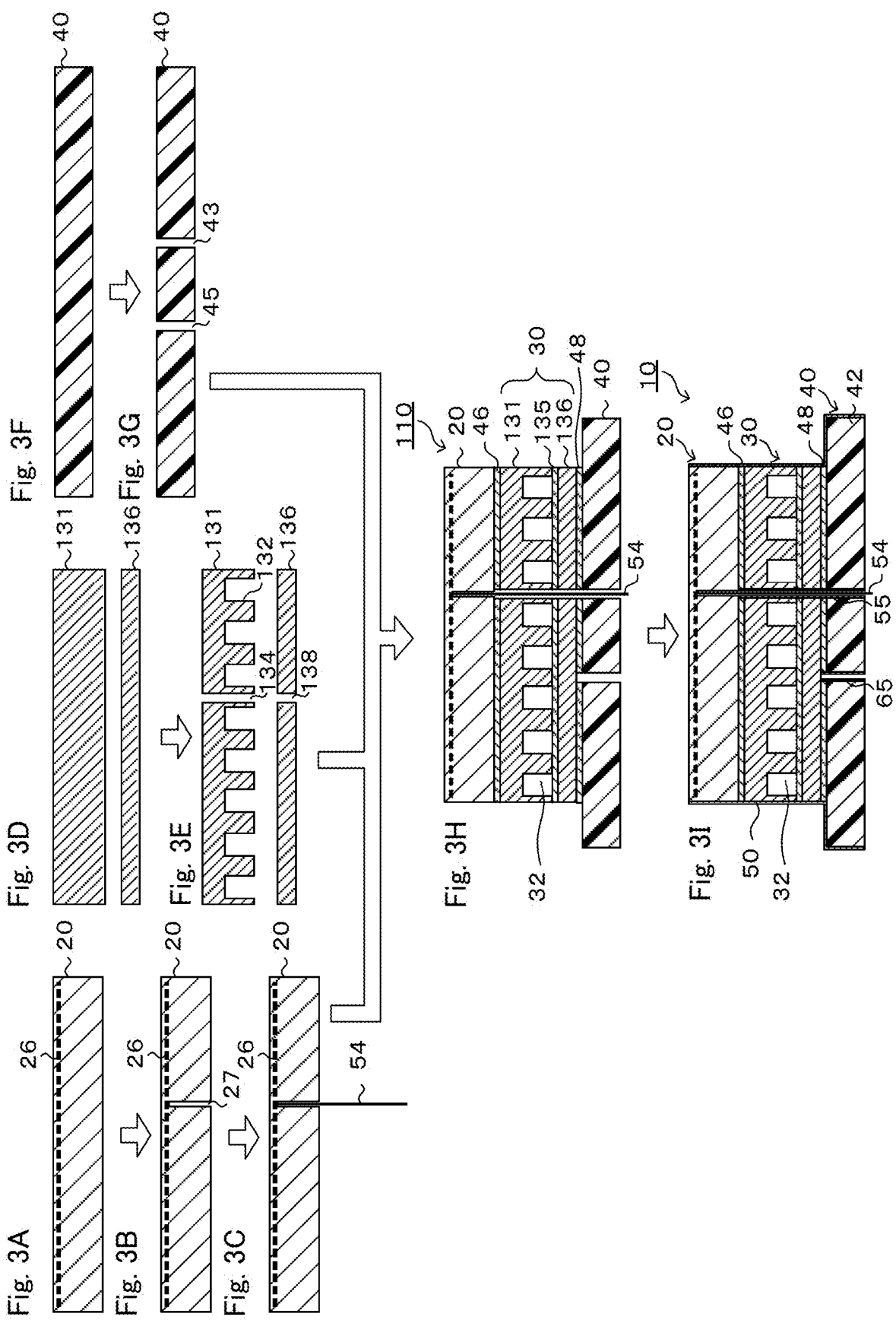
FIGS. 3A to 3I illustrate processes of manufacturing the wafer placement table 10.

An example of manufacture of the wafer placement table 10 will now be described with reference to FIGS. 3A to 3I. FIGS. 3A to 3I illustrate processes of manufacturing the wafer placement table 10. In this example, the conductive substrate 30 is made of MMC, and the support substrate 40 is made of ceramic. First, the ceramic substrate 20 containing therein the wafer attracting electrode 26 is prepared (FIG. 3A). For example, a ceramic powder molded body containing the wafer attracting electrode 26 therein is made, and the molded body is hot-press fired to produce the ceramic substrate 20. Next, a hole 27 is formed, which extends from the lower surface of the ceramic substrate 20 to the wafer attracting electrode 26 (FIG. 3B). The feed terminal 54 is inserted into the hole 27 and joined to the wafer attracting electrode 26 (FIG. 3C).

At the same time, two MMC disk members 131 and 136 are made (FIG. 3D). A groove 132, which eventually serves as the cooling medium passage 32, is formed in the lower surface of the MMC disk member 131 on the upper side (which may hereinafter be referred to as "upper MMC disk member 131"), and through holes 134 and 138 are formed to vertically penetrate the MMC disk members 131 and 136, respectively (FIG. 3E). When the ceramic substrate 20 is an alumina substrate, the MMC disk members 131 and 136 are preferably made of SisiCTi or AlSiC. This is because the thermal expansion coefficient of alumina is substantially the same as the thermal expansion coefficients of SiSiCTi and AlSiC.

For example, a SisiCTi disk member can be made in the following manner. First, silicon carbide, metallic Si, and metallic Ti are mixed together to form a powder mixture. The resulting powder mixture is subjected to uniaxial pressing to form a disk-shaped molded body. Then, the molded body is hot-press sintered under inert atmosphere to produce a SisiCTi disk member.

At the same time, the support substrate 40 made of a ceramic material is prepared (FIG. 3F). For example, the support substrate 40 is produced by making a ceramic powder molded body and hot-press firing the molded body. When the ceramic substrate 20 is an alumina substrate, the support substrate 40 is preferably made of alumina. For cost reduction, the alumina used to form the support substrate 40 may be of lower purity than the alumina used to form the ceramic substrate 20. Through holes 43 and 45 are then formed to vertically penetrate the support substrate 40 (FIG. 3G).

Next, a layer of metal joining material is placed between the lower surface of the MMC disk member 136 on the lower side (which may hereinafter be referred to as "lower MMC disk member 136") and the upper surface of the support substrate 40. The layer of metal joining material is provided with a through hole communicating with the through hole 43 and a through hole communicating with the through hole 45. Another layer of metal joining material is placed between the lower surface of the upper MMC disk member 131 and the upper surface of the lower MMC disk member 136, and still another layer of metal joining material is placed on the upper surface of the upper MMC disk member 131. Each of the layers of metal joining material is provided with a through hole communicating with the through holes 134 and 138. The feed terminal 54 in the ceramic substrate 20 is inserted into the through holes 134 and 138 in the MMC disk members 131 and 136 and the through hole 43 in the support substrate 40, and the ceramic substrate 20 is placed on the layer of metal joining material on the upper surface of the upper MMC disk member 131. The support substrate 40, a layer of metal joining material, the lower MMC disk member 136, another layer of metal joining material, the upper MMC disk member 131, still another layer of metal joining material, and the ceramic substrate 20 are thus stacked in this order from the bottom to form a layered body. Applying heat and pressure at the same time to the layered body (by means of TCB) produces a joined body 110 (FIG. 3H). The joined body 110 includes the support substrate 40, the conductive substrate 30 joined to the upper surface of the support substrate 40 with the second joining layer 48 (metal joining layer) therebetween, and the ceramic substrate 20 joined to the upper surface of the conductive substrate 30 with the first joining layer 46 (metal joining layer) therebetween. The conductive substrate 30 includes the upper MMC disk member 131 and the lower MMC disk member 136 that are joined together, with a metal joining layer 135 therebetween. The conductive substrate 30 has the cooling medium passage 32 therein.

The TCB described above is performed, for example, in the following manner. That is, after pressure-bonding of the layered body at a temperature lower than or equal to the solidus temperature of the metal joining material (e.g., at a temperature higher than or equal to a temperature obtained by subtracting 20° C. from the solidus temperature and lower than or equal to the solidus temperature), the layered body is left to reach room temperature. The metal joining material is thus formed into a metal joining layer. Examples of the metal joining material include an Al—Mg joining material and an Al—Si—Mg joining material. For example, when TCB is performed using an Al—Si—Mg joining material, the layered body is subjected to pressure while being heated under vacuum atmosphere. It is preferable to use a metal joining material that is around 100 μm thick.

Next, the insulating pipe 55 for insertion of the feed terminal 54 is placed in the through holes 134, 138, and 43 and the holes in the layers of metal joining material. The insulating pipe 65 for insertion of the feed terminal 64 is also placed in the through hole 45 and the hole in the layer of metal joining material. Additionally, the insulating film 50 is formed by thermally spraying, with ceramic powder, the side face of the ceramic substrate 20, the perimeter of the first joining layer 46, the side face of the conductive substrate 30, the perimeter of the second joining layer 48, and the upper surface and the side face of the mounting flange 42 of the support substrate 40 (FIG. 3I). The wafer placement table 10 is thus produced.

Although the conductive substrate 30 illustrated in FIG. 1 has been described as a single integrated structure, it may be a structure composed of two components joined together by a metal joining layer, as illustrated in FIG. 3I, or may be a structure composed of three or more components joined together by metal joining layers.

An example of how the wafer placement table 10 is used will now be described with reference to FIG. 1. As described above, the wafer placement table 10 is secured by the clamp member 70 to the installation plate 96 in the chamber 94. A ceiling surface of the chamber 94 is provided with a showerhead 98 having many gas injection holes through which a process gas is released into the chamber 94.

A disc-shaped wafer W is placed on the wafer placement surface 22a of the wafer placement table 10. In this state, the DC voltage of the wafer attracting DC power supply 52 is applied to the wafer attracting electrode 26 to cause the wafer placement surface 22a to attract the wafer W. The inside of the chamber 94 is set to have a predetermined vacuum atmosphere (or a reduced pressure atmosphere), and an RF voltage from the RF power supply 62 is applied to the conductive substrate 30 while supplying a process gas from the shower head 98. Then a plasma is generated between the wafer W and the shower head 98. The plasma is utilized to perform CVD film formation and etching on the wafer W.

The wafer W needs to be efficiently cooled down when processed with high-power plasma. In the wafer placement table 10, a metal joining layer with high thermal conductivity, not a resin layer with low thermal conductivity, is used as the first joining layer 46 between the ceramic substrate 20 and the conductive substrate 30. This allows the wafer placement table 10 to have a high capability of removing heat from the wafer W. A difference in thermal expansion between the ceramic substrate 20 and the conductive substrate 30 is small and unlikely to cause a problem even if the first joining layer 46 does not have high stress relaxation properties.

In the wafer mounting table 10 described above, a part of the support substrate 40 radially extending out of the conductive substrate 30 is used as the mounting flange 42, but since the support substrate 40 is formed of an insulating material, it is electrically insulated from the conductive substrate 30. Therefore, the mounting flange 42 does not function as a plasma generating electrode, and generation of plasma in the region directly above the mounting flange 42 is suppressed. This can increase the plasma density in the region directly above the ceramic substrate 20.

Since the support substrate 40 is formed of an insulating material, the support substrate 40 can be electrically insulated from the conductive substrate 30 relatively easily.

Since both the first joining layer 46 and the second joining layer 48 are metal joining layers, joining the ceramic substrate 20 to the conductive substrate 30 and joining the conductive substrate 30 to the support substrate 40 can take place in the same process, and this reduces the cost of manufacture.

Second Embodiment

Figure 4:
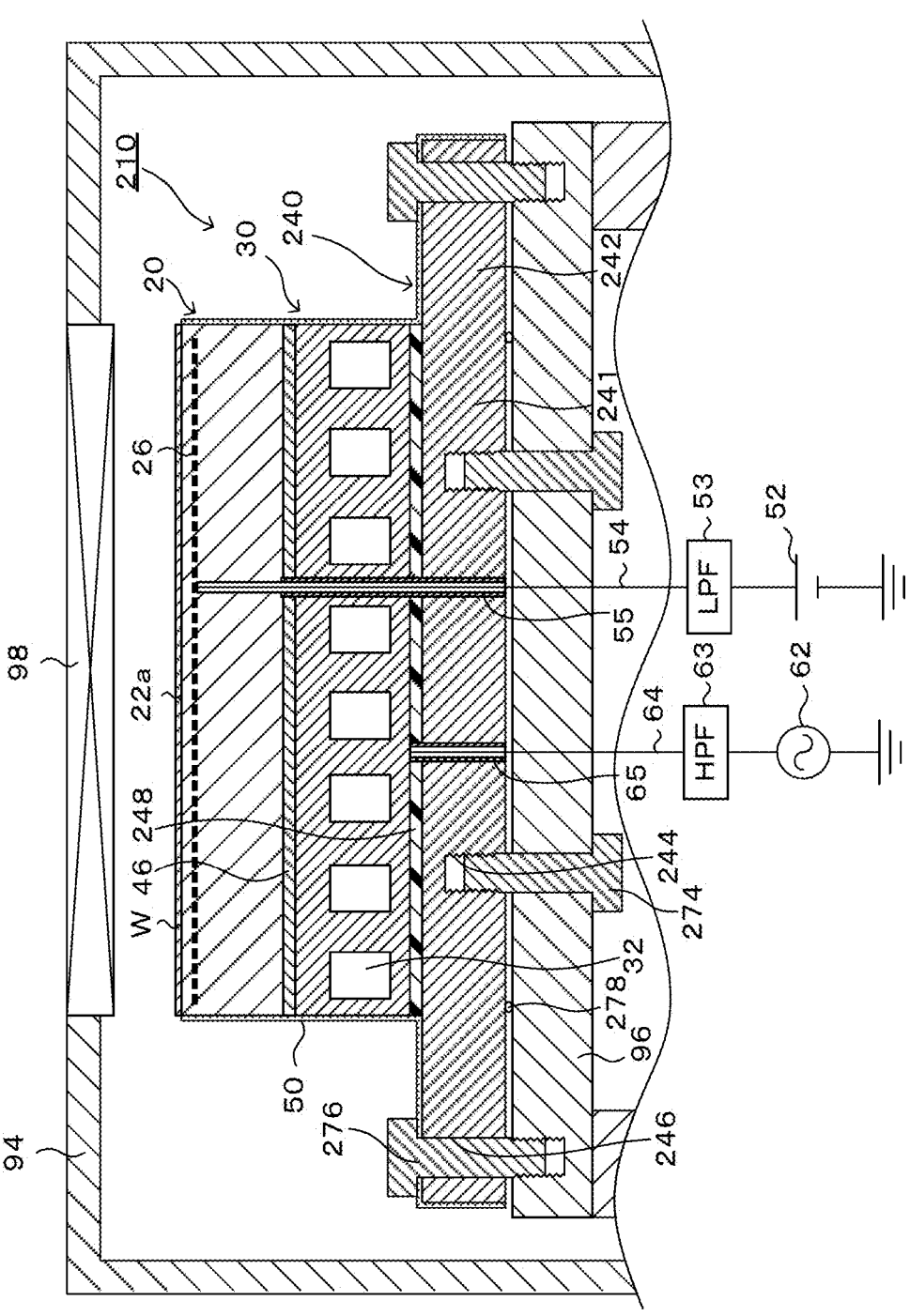
FIG. 4 illustrates a vertical cross-sectional view of a wafer placement table 210 installed in the chamber 94.

A second embodiment of the present invention will now be described with reference to the drawings. FIG. 4 illustrates a vertical cross-sectional view of a wafer placement table 210 installed in the chamber 94 (i.e., a cross-section taken along a plane containing a central axis of the wafer placement table 210). The wafer placement table 210 is used to perform, for example, plasma CVD or plasma etching on the wafer W. The wafer placement table 210 is secured to the installation plate 96 that is disposed inside the chamber 94 designed for semiconductor processes. The wafer placement table 210 includes the ceramic substrate 20, the conductive substrate 30, and a support substrate 240. In the second embodiment, the same component elements as those in the first embodiment are denoted by the same reference numerals and their description will be omitted.

The support substrate 240 is a circular plate having a greater diameter than the conductive substrate 30 and is disposed on the lower surface of the conductive substrate 30. The support substrate 240 has a central portion 241 having the same diameter as the conductive substrate 30, and a mounting flange 242 radially extending out of the conductive substrate 30. The support substrate 240 is formed of a metal material. Examples of the metal material include Al, Ti, Mo, and alloys of these materials. The lower surface of the support substrate 240 has a plurality of screw holes 244. In the central portion 241 of the support substrate 240, the plurality of (e.g., six or eight) screw holes 244 are arranged roughly along a concentric circle of the support substrate 240 (e.g., along a circle with a diameter $\frac{1}{2}$ or $\frac{1}{3}$ that of the wafer W) at substantially regular intervals. The plurality of screw holes 244 are internally (or female) threaded and open on the lower surface of the support substrate 240. The mounting flange 242 of the support substrate 240 has a plurality of through holes 246. The plurality of (e.g., eight or twelve) through holes 246 are arranged roughly along a concentric circle of the support substrate 240 at substantially regular intervals. The plurality of through holes 246 vertically penetrate the mounting flange 242 and open on the upper and lower surfaces of the mounting flange 242.

The conductive substrate 30 and the support substrate 240 are provided with a second joining layer 248, which is an insulating layer, therebetween. The second joining layer 248 electrically insulates the support substrate 240 from the conductive substrate 30. The second joining layer 248 is constituted by an adhesive sheet made of an insulating resin, such as silicone resin, acrylic resin, polyimide resin, or epoxy resin. The second joining layer 248 is a circular layer having the same diameter as the lower surface of the conductive substrate 30. The second joining layer 248 may have a single-layer or multilayer structure. The second joining layer 248 may be a sheet including a polypropylene core with acrylic resin layers on both sides thereof, a sheet including a polyimide core with silicone resin layers on both sides thereof, or an epoxy resin sheet.

The wafer placement table 210 is mounted with bolts 274 and bolts 276 to the installation plate 96 disposed inside the chamber 94. The wafer placement table 210 and the installation plate 96 are provided with a seal ring 278 therebetween. The seal ring 278 is a metal or resin ring disposed slightly inside the outer edge of the central portion 241 of the support substrate 240. A leg of each of the bolts 274 is externally (or male) threaded. The bolts 274 are each inserted from the lower surface of the installation plate 96 into a through hole in the installation plate 96 opposite a corresponding one of the screw holes 244 in the support substrate 240, and screwed into the screw hole 244. A leg of each of the bolts 276 is also externally (or male) threaded. The bolts 276 are each inserted from the upper surface of the mounting flange 242 into a corresponding one of the through holes 246 in the mounting flange 242, and screwed into a screw hole in the installation plate 96 opposite the through hole 246. The screw hole is internally (or female) threaded and opens on the upper surface of the installation plate 96. The bolts 274 and the bolts 276 may be made of an insulating material or a conductive material (such as metal). The bolts 274 and the bolts 276 are preferably made of a ductile material (e.g., Ti, Mo, or W).

Figure 5:
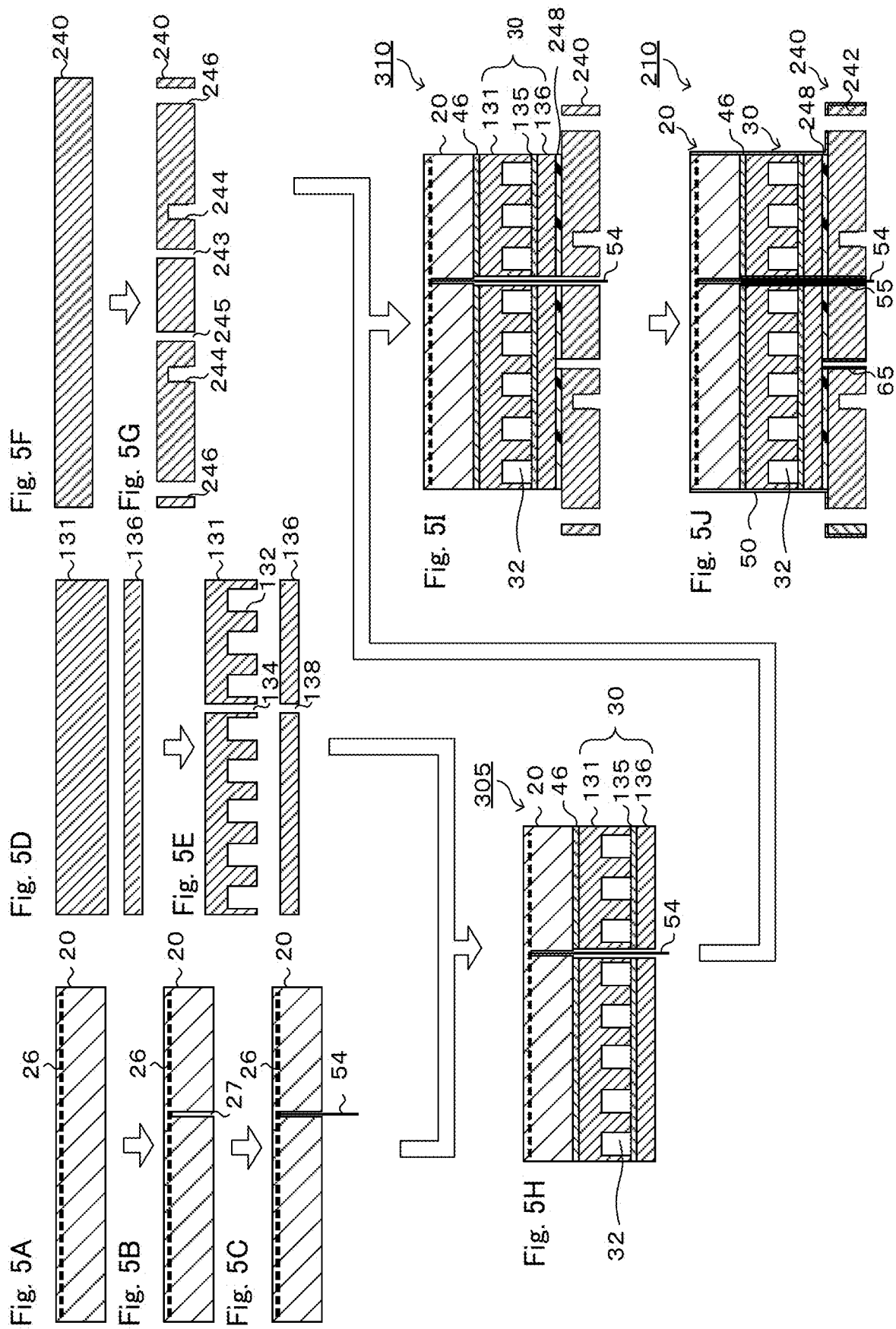
FIGS. 5A to 5J illustrate processes of manufacturing the wafer placement table 210.

An example of manufacture of the wafer placement table 210 will now be described with reference to FIGS. 5A to 5J. FIGS. 5A to 5J illustrate processes of manufacturing the wafer placement table 210. In this example, the conductive substrate 30 is made of MMC, and the support substrate 240 is made of metal. To manufacture the wafer placement table 210, first, the same process as that illustrated in FIGS. 3A to 3E is performed (see FIGS. 5A to 5E). At the same time, the support substrate 240 made of a metal material is prepared (FIG. 5F). This is followed by forming through holes 243 and 245 vertically penetrating the support substrate 240, forming the screw holes 244 in the lower surface of the support substrate 240, and forming the through holes 246 vertically penetrating an outer part of the support substrate 240 (FIG. 5G).

Next, a layer of metal joining material is placed between the lower surface of the upper MMC disk member 131 and the upper surface of the lower MMC disk member 136, and another layer of metal joining material is placed on the upper surface of the upper MMC disk member 131. Each of the layers of metal joining material is provided with a through hole communicating with the through holes 134 and 138. The feed terminal 54 in the ceramic substrate 20 is inserted into the through holes 134 and 138 in the MMC disk members 131 and 136, and the ceramic substrate 20 is placed on the layer of metal joining material on the upper surface of the upper MMC disk member 131. The lower MMC disk member 136, a layer of metal joining material, the upper MMC disk member 131, another layer of metal joining material, and the ceramic substrate 20 are thus stacked in this order from the bottom to form a layered body. Applying heat and pressure at the same time to the layered body (by means of TCB) produces a joined body 305 (FIG. 5H). The joined body 305 includes the conductive substrate 30 and the ceramic substrate 20 joined to the upper surface of the conductive substrate 30, with the first joining layer 46 (metal joining layer) therebetween.

Next, an adhesive sheet is placed on the upper surface of the support substrate 240 to form the second joining layer 248. The adhesive sheet is provided with a through hole communicating with the through holes 134, 138, and 243 and a through hole communicating with the through hole 245. The feed terminal 54 in the joined body 305 is inserted into the through hole 243 in the support substrate 240, and the joined body 305 is placed on the adhesive sheet on the upper surface of the support substrate 240. The support substrate 240, the adhesive sheet, and the joined body 305 are thus stacked in this order from the bottom to form a layered body. The layered body is pressed by vacuum pressing while being heated to cure the adhesive sheet, and the joined body 305 and the support substrate 240 are joined together by the second joining layer 248, which is an insulating layer, to produce a joined body 310 (FIG. 5I).

Next, the insulating pipe 55 for insertion of the feed terminal 54 is placed in the through holes 134, 138, and 243 and the holes in the layers of metal joining material and the adhesive sheet. The insulating pipe 65 for insertion of the feed terminal 64 is also placed in the through hole 245 and the hole in the adhesive sheet. Additionally, the insulating film 50 is formed by thermally spraying, with ceramic powder, the side face of the ceramic substrate 20, the perimeter of the first joining layer 46, the side face of the conductive substrate 30, the perimeter of the second joining layer 248, and the upper surface and the side face of the mounting flange 242 of the support substrate 240 (FIG. 5J). The wafer placement table 210 is thus produced. In the second embodiment, the insulating film 50 on the side face of the ceramic substrate 20 and the perimeter of the second joining layer 248 may be partially, or entirely, removed. The insulating film 50 may be formed before forming the joined body 310. For example, forming the insulating film 50 on the joined body 305 and the support substrate 240 may be followed by joining the joined body 305 and the support substrate 240 together.

The wafer placement table 210 can be used similarly to the exemplary use of the wafer placement table 10.

In the wafer placement table 210 described above, a part of the support substrate 240 radially extending out of the conductive substrate 30 is used as the mounting flange 242, and the support substrate 240 is joined to the conductive substrate 30, with the second joining layer 248 therebetween. The second joining layer 248, which is an insulating layer, electrically insulates the support substrate 240 from the conductive substrate 30. Therefore, the mounting flange 242 does not function as a plasma generating electrode, and generation of plasma in the region directly above the mounting flange 242 is suppressed. This can increase the plasma density in the region directly above the ceramic substrate 20.

The support substrate 240 and the conductive substrate 30 are provided with the second joining layer 248, which is an insulating layer, therebetween. This allows the support substrate 240 to be electrically insulated from the conductive substrate 30 even when the support substrate 240 is made of metal. Also, since the support substrate 240 is made of metal, which is a ductile material, the screw holes 244 can be formed in the lower surface of the support substrate 240. Since the lower surface of the support substrate 240 thus has the screw holes 244, the wafer placement table 210 can be mounted onto the installation plate 96 at the central portion 241 of the support substrate 240.

The present invention not limited to the embodiments described above, and may be implemented in various ways within the technical scope of the present invention.

Figure 6:
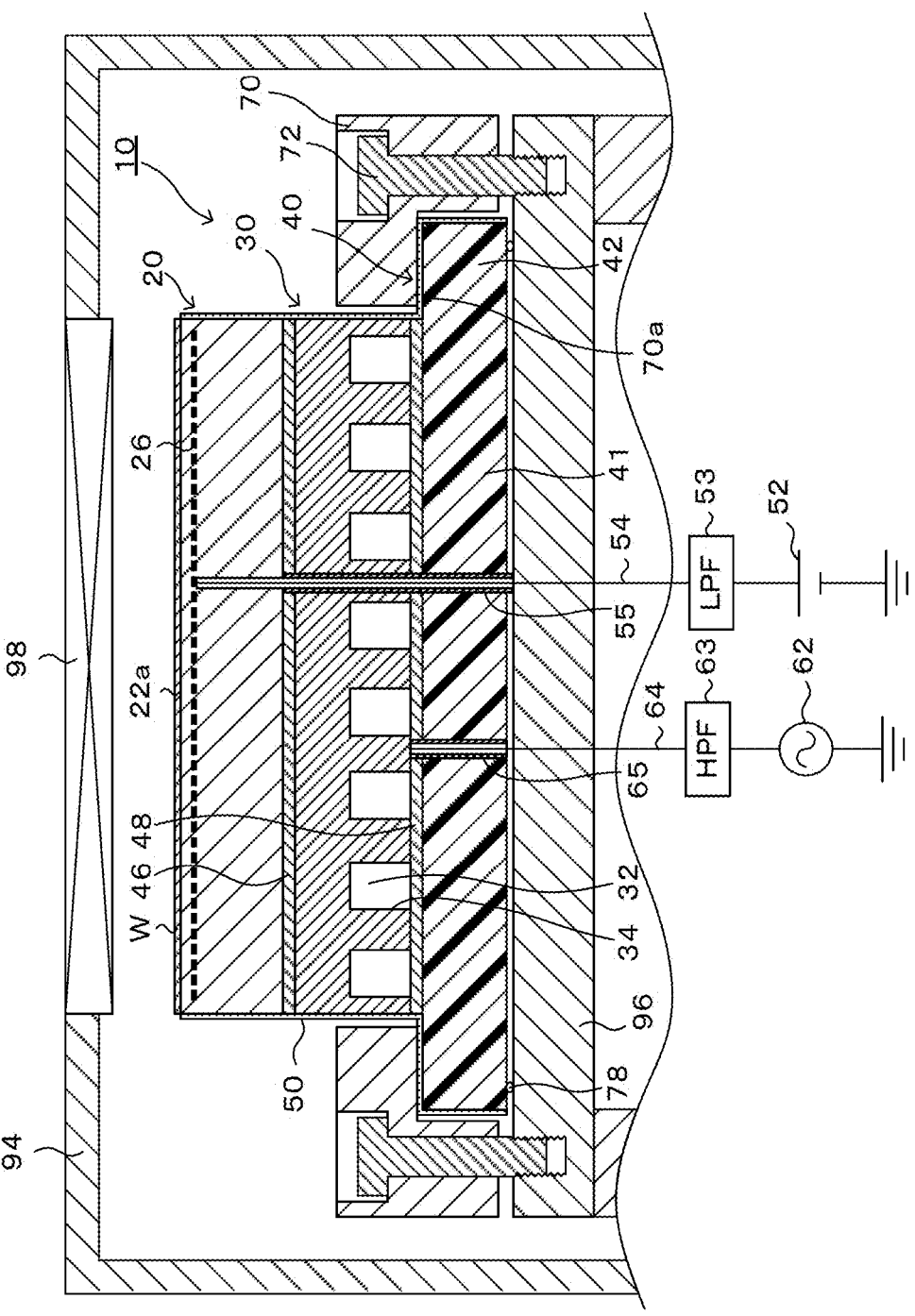
FIG. 6 illustrates a vertical cross-sectional view of an example of the wafer placement table 10.

For example, although the conductive substrate 30 has therein the cooling medium passage 32 in the first and second embodiments, the configuration is not particularly limited to this. For example, as illustrated in FIG. 6, the conductive substrate 30 may have a cooling medium passage groove 34 in the lower surface thereof. In this case, the second joining layer 48 disposed adjacent to the lower surface of the conductive substrate 30 closes the lower opening of the cooling medium passage groove 34 to define the cooling medium passage 32. Since this eliminates the need for the material (MMC disk member 136) on the lower side of the cooling medium passage 32, the manufacturing cost can be lower than that in the case where the conductive substrate 30 has the cooling medium passage 32 therein. In FIG. 6, the same component elements as those in the embodiments described above are denoted by the same reference numerals. The conductive substrate 30 may have a cooling medium passage groove in the upper surface thereof, or may have neither the cooling medium passage nor the cooling medium passage groove.

In the first and second embodiments, the wafer placement tables 10 and 210 may have holes that extend therethrough from the lower surface of the conductive substrate 30 to reach the wafer placement surface 22a. Examples of such holes include gas supply holes for supplying a heat-transfer gas (e.g., He gas) to the back surface of the wafer W, and lift pin holes for insertion of lift pins with which the wafer W is lifted and lowered with respect to the wafer placement surface 22a. The heat-transfer gas is supplied to spaces formed by the wafer W and many small protrusions (which support the wafer W and are not shown) on the wafer placement surface 22a. For example, for supporting the wafer W with three lift pins, lift pin holes are provided at three points. The lower surface of the support substrate 40 or 240 and the upper surface of the installation plate 96 may be provided with a resin or metal seal ring (e.g., O ring) therebetween, at a position corresponding to the holes described above.

Although the ceramic substrate 20 contains the wafer attracting electrode 26 in the first and second embodiments, the ceramic substrate 20 may contain a heater electrode (resistance heating element), instead of the wafer attracting electrode 26. In this case, the heater electrode is connected to a heater power supply. The ceramic substrate 20 may contain a single electrode layer, or may contain two or more electrode layers that are spaced apart.

Although the first joining layer 46 by which the ceramic substrate 20 and the conductive substrate 30 are joined together is a metal joining layer in the first and second embodiments, the first joining layer 46 may be a resin joining layer.

Although the second joining layer 48 is a metal joining layer in the first embodiment described above, the second joining layer 48 may be a resin joining layer.

In the first embodiment described above, the upper end of the feed terminal 64 is in contact with the lower surface of the conductive substrate 30. When the second joining layer 48 is a metal joining layer, however, the upper end of the feed terminal 64 may be in contact with the lower surface of the second joining layer 48. In this case, the through hole for insertion of the feed terminal 64 (i.e., the through hole communicating with the through hole 45) may not be provided in the second joining layer 48 and the layer of metal joining material of which to make the second joining layer 48.

Although the support substrate 240 has the screw holes 244 and the through holes 246 in the second embodiment described above, the screw holes 244 or the through holes 246, or both the screw holes 244 and the through holes 246, may be removed. Instead of forming the through holes 246, the clamp member 70 may be used (as in the first embodiment) to mount the mounting flange 242 onto the installation plate 96. The screw holes 244 may be formed in the lower surface of the mounting flange 242, instead of being formed in the lower surface of the central portion 241.

In the first and second embodiments described above, the ceramic substrate 20 is made by hot-press firing of a ceramic powder molded body. The molded body may be made by stacking a plurality of tape-cast layers, by a mold casting method, or by compacting ceramic powder. The same applies to the support substrate 40 of the first embodiment.

What is claimed is:

1. A wafer placement table comprising:
   a ceramic substrate having a wafer placement surface on an upper surface thereof, the ceramic substrate containing an electrode therein;
   a conductive substrate disposed adjacent to a lower surface of the ceramic substrate, having a cooling medium passage or a cooling medium passage groove, serving also as a plasma generating electrode;
   a support substrate disposed adjacent to a lower surface of the conductive substrate, having a greater diameter than the conductive substrate, and electrically insulated from the conductive substrate; and
   a mounting flange constituting a part of the support substrate and radially extending out of the conductive substrate.

2. The wafer placement table according to claim 1, wherein the conductive substrate is made of metal matrix composite.

3. The wafer placement table according to claim 1, wherein the conductive substrate is made of SiSiCTi.

4. The wafer placement table according to claim 1, wherein the conductive substrate is made of AlSiC.

5. The wafer placement table according to claim 1, wherein the support substrate is formed of an insulating material.

6. The wafer placement table according to claim 5, wherein a first joining layer configured to join the ceramic substrate to the conductive substrate and a second joining layer configured to join the conductive substrate to the support substrate are both metal joining layers.

7. The wafer placement table according to claim 5, wherein the conductive substrate has the cooling medium passage groove, and the cooling medium passage groove has an opening in the surface of the conductive substrate facing the support substrate.

8. The wafer placement table according to claim 1, wherein the support substrate is formed of metal, and the support substrate and the conductive substrate are provided with an insulating layer therebetween.

9. The wafer placement table according to claim 8, wherein the support substrate has screw holes in a lower surface thereof.

* * * * *